(12) United States Patent
Lu et al.

(10) Patent No.: US 11,968,845 B2
(45) Date of Patent: Apr. 23, 2024

(54) THIN FILM TRANSISTOR AND FILTER USING THIN FILM TRANSISTOR

(71) Applicants: Tsinghua University, Beijing (CN); HON HAI PRECISION INDUSTRY CO., LTD., New Taipei (TW)

(72) Inventors: Gao-Tian Lu, Beijing (CN); Yang Wei, Beijing (CN); Shou-Shan Fan, Beijing (CN); Yue-Gang Zhang, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 252 days.

(21) Appl. No.: 17/577,131

(22) Filed: Jan. 17, 2022

(65) Prior Publication Data
US 2023/0060340 A1 Mar. 2, 2023

(30) Foreign Application Priority Data
Sep. 2, 2021 (CN) .......................... 202111026821.9

(51) Int. Cl.
| H01L 23/00 | (2006.01) |
| H03H 11/04 | (2006.01) |
| H10K 10/46 | (2023.01) |
| H10K 85/20 | (2023.01) |

(52) U.S. Cl.
CPC .......... *H10K 10/474* (2023.02); *H03H 11/04* (2013.01); *H10K 10/466* (2023.02); *H10K 10/484* (2023.02); *H10K 85/221* (2023.02)

(58) Field of Classification Search
CPC .. H10K 10/474; H10K 10/466; H10K 10/484; H10K 85/221
See application file for complete search history.

(56) References Cited

U.S. PATENT DOCUMENTS

| 9,159,938 B2 | 10/2015 | Zou et al. |
| 10,529,806 B2 | 1/2020 | Kim et al. |

FOREIGN PATENT DOCUMENTS

| CN | 104103695 | 10/2014 |
| TW | 201824224 | 7/2018 |

*Primary Examiner* — Anthony Ho
(74) *Attorney, Agent, or Firm* — ScienBiziP, P.C.

(57) ABSTRACT

A thin film transistor includes a gate electrode, a gate insulating layer, a carbon nanotube structure, a source electrode and a drain electrode. The gate insulating layer is located on the gate electrode. The carbon nanotube structure is located on the gate insulating layer. The source electrode and the drain electrode are arranged at intervals and electrically connected to the carbon nanotube structure respectively. The thin film transistor further includes an interface charge layer, and the interface charge layer is located between the carbon nanotube structure and the gate insulating layer.

20 Claims, 16 Drawing Sheets

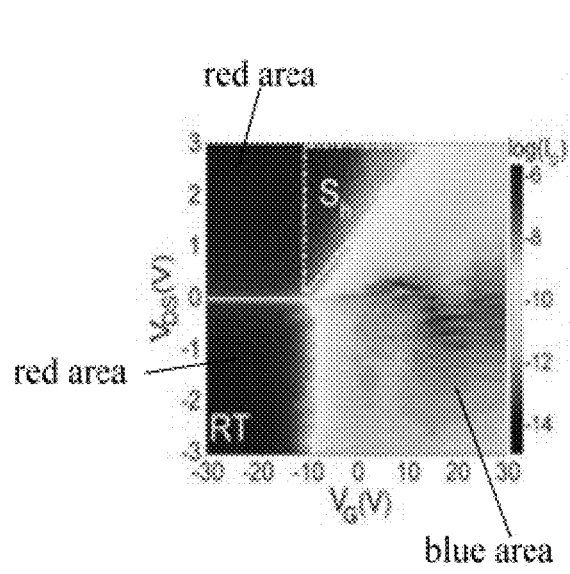
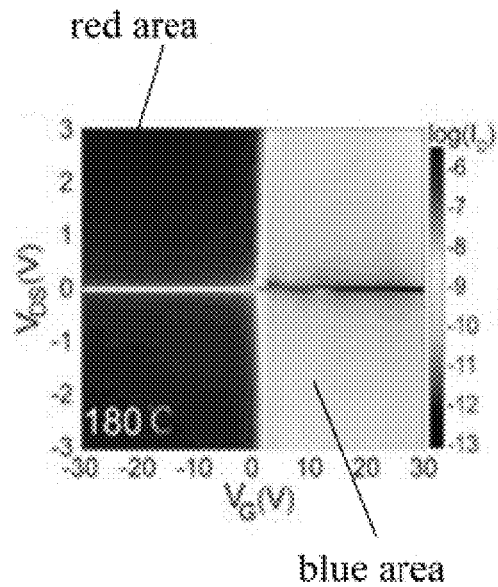
FIG.8A　　　　　　　　FIG.8B
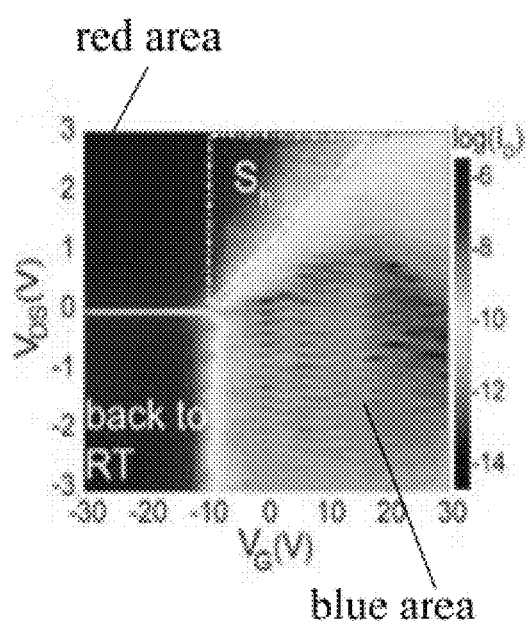
FIG.8C

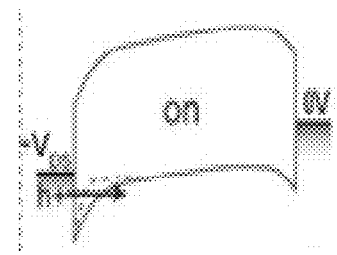 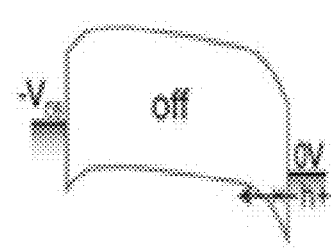
FIG.12A    FIG.12B
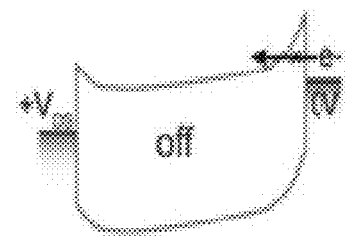 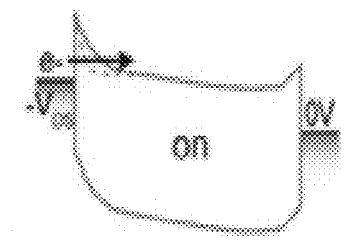
FIG.12C    FIG.12D

THIN FILM TRANSISTOR AND FILTER USING THIN FILM TRANSISTOR

CROSS-REFERENCE TO RELATED APPLICATIONS

This application claims all benefits under 35 U.S.C. § 119 from the Chinese Patent Application No. 202111026821.9, filed on Sep. 2, 2021, in the China National Intellectual Property Administration, the disclosure of which is incorporated herein by reference.

FIELD

The present application relates to a thin film transistor and a filter using the thin film transistor.

BACKGROUND

As the semiconductor industry enters the post-Moore era, reconfigurability on the device level, that incorporates multifunction in a device unit to realize more complex systems with more compact logic gates, is a promising methodology to extend the development of integrated circuit industry.

Low-dimension materials are considered to be ideal building blocks for reconfigurable devices owning to their unique geometry structures, atomic flat surfaces and ambipolar transport properties. Multi-gate geometry with at least two independently controllable gates has been proven to be a potential solution, and reconfigurable logic gates were constructed with $MoS_2$, $WSe_2$, $MoTe_2$, and BP homojunctions. Beyond homojunction devices, two-dimensional (2D) van der Waals heterostructures have also been widely investigated to realize reconfigurable multifunction, such as reconfigurable neural network vision sensor based on $WSe_2$/hBN, multilingual artificial synapses based on BP/$ReS_2$. Moreover, the contact barrier can also play a significant role in controlling transport properties of low-dimensional transistors. However, rectification properties of transistors made of two-dimensional semiconductor materials are relatively weak, at the same time, asymmetric contacts introduced during the manufacturing process can also affect the rectification properties.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views. Implementations of the present technology will be described, by way of example only, with reference to the attached figures, wherein

FIG. 8A is an I-V contour map of an embodiment of the thin film transistor at room temperature.

FIG. 8B is an I-V contour map of an embodiment of the thin film transistor at 180 degrees Celsius.

FIG. 8C is an I-V contour map of an embodiment of the thin film transistor at room temperature.

FIG. 12A is a schematic diagram of the energy band principle of the thin film transistor under a negative gate voltage.

FIG. 12B is a schematic diagram of the energy band principle of the thin film transistor under a negative gate voltage.

FIG. 12C is a schematic diagram of the energy band principle of the thin film transistor under a positive gate voltage.

FIG. 12D is a schematic diagram of the energy band principle of the thin film transistor under a positive gate voltage.

DETAILED DESCRIPTION

Figure 1:
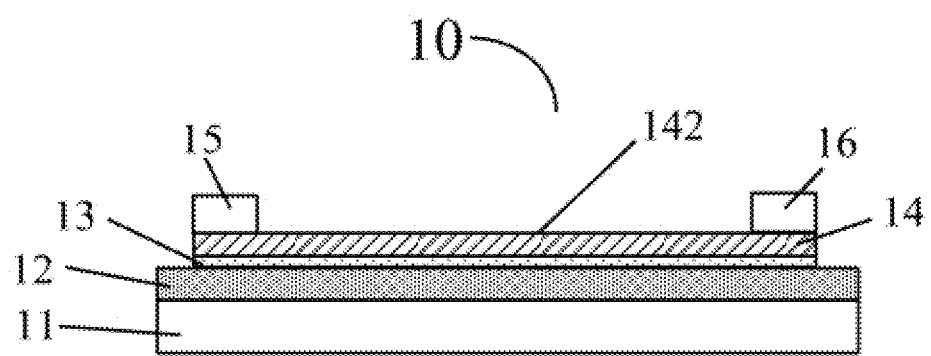
FIG. 1 is a schematic view of an embodiment of a thin film transistor.

It will be appreciated that for simplicity and clarity of illustration, where appropriate, reference numerals have been repeated among the different figures to indicate corresponding or analogous elements. In addition, numerous specific details are set forth to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to better illustrate details and features. The description is not to be considered as limiting the scope of the embodiments described herein.

Several definitions that apply throughout this disclosure will now be presented.

The connection can be such that the objects are permanently connected or releasably connected. The term "substantially" is defined to be essentially conforming to the particular dimension, shape, or other feature that the term modifies, such that the component need not be exact. The term "comprising" means "including, but not necessarily limited to"; it specifically indicates open-ended inclusion or membership in a so-described combination, group, series, and the like. It should be noted that references to "an" or "one" embodiment in this disclosure are not necessarily to the same embodiment, and such references mean "at least one."

Referring to FIG. 1, an embodiment of a thin film transistor 10 is provided. The thin film transistor 10 includes a gate electrode 11, a gate insulating layer 12, an interface charge layer 13, a carbon nanotube structure 14, a source electrode 15, and a drain electrode 16. The gate insulating layer 12 is disposed on a surface of the gate electrode 11. The carbon nanotube structure 14 is disposed on a surface of the gate insulating layer 12 away from the gate electrode 11. The interface charge layer 13 is located between the carbon nanotube structure 14 and the gate insulating layer 12. In one embodiment, the interface charge layer 13 is in direct contact with the surface of the gate insulating layer 12, and the carbon nanotube structure 14 is in direct contact with a surface of the interface charge layer 13 away from the gate insulating layer 12. The source electrode 15 and the drain electrode 16 are arranged at intervals, and are electrically connected to the carbon nanotube structure 14 respectively. The carbon nanotube structure 14 located between the source electrode 15 and the drain electrode 16 forms a channel 142.

The material of the gate electrode 11 is a conductive material. The conductive material can be metal, ITO, ATO, conductive silver glue, doped silicon, conductive polymer, conductive carbon nanotube, and the like. The material of the metal can be aluminum, copper, tungsten, molybdenum, gold, titanium, palladium or any combination of alloys. In one embodiment, the material of the gate electrode 11 is doped silicon wafers.

The material of the gate insulating layer 12 can be hard materials, such as aluminum oxide, hafnium oxide, silicon nitride, or silicon oxide. The thickness of the gate insulating layer 12 is in a range from 0.5 nanometers to 100 micrometers. In one embodiment, the material of the gate insulating layer 12 is silicon oxide.

The interface charge layer 13 is located between the carbon nanotube structure 14 and the gate insulating layer 12. The interface charge layer 13 is an interface layer comprising charges captured by chemical molecular groups or water molecules, and the interface layer is attached to the surface of the gate insulating layer 12. Furthermore, the interface charge layer 13 is located between the channel 142 and the gate insulating layer 12. The position of the charges of the interface charge layer 13 can change as a bias voltage between the source electrode 15 and the drain electrode 16 changes. Furthermore, the charges are confined within the interface charge layer 13. When the polarity of the source electrode 15 and the drain electrode 16 changes, the position of the charges also changes within the interface charge layer 13. The charges can accumulate at a position of the drain electrode 16 or move away from the position of the drain electrode 16 according to the polarity of the source electrode 15 and the drain electrode 16. The movement of charges affects a potential distribution between the source electrode 15 and the drain electrode 16, which will change a width of the Schottky barrier at the source electrode 15 and the drain electrode 16. Therefore, the interface charge layer 13 plays a self-gating effect in the thin film transistor 10.

The carbon nanotube structure 14 is one-dimensional semiconductor structure. The material of the carbon nanotube structure 14 is a one-dimensional semiconductor nanomaterial. The one-dimensional semiconductor nanomaterial can be carbon nanotube wires. The carbon nanotube structure 14 is semiconducting character. Here, the "one-dimensional structure" means the size of the structure in one dimension of the three dimensions is much larger than the sizes of the other two dimensions of the three dimensions. the "one-dimensional nanomaterial" means a material whose size in only one of the three dimensions is not between 0.1-100 nm. Compared with a planar structure, a one-dimensional cylindrical geometry of the carbon nanotube structure 14 has a larger surface capacitance and is more sensitive to the distribution of charges of the environment. The carbon nanotube structure 14 includes at least one carbon nanotube. When the carbon nanotube structure 14 includes a plurality of carbon nanotubes, the plurality of carbon nanotubes are closely connected end to end through van der Waals force to form carbon nanotube wires, the plurality of carbon nanotubes extend substantially in a same direction. In one embodiment, the carbon nanotube structure 14 consists of at least one carbon nanotube. The plurality of carbon nanotubes of the carbon nanotube structure 14 can be single-wall carbon nanotubes, double-wall carbon nanotubes, and multi-wall carbon nanotubes. The diameter of the single-wall carbon nanotubes is in a range of 0.5 nanometers to 10 nanometers, the diameter of the double-wall carbon nanotubes is in a range of 1.0 nanometer to 15 nanometers, the diameter of the multi-wall carbon nanotubes is in a range of 1.5 nanometers to 50 nanometers. The length of the plurality of carbon nanotubes is greater than 50 micrometers. In one embodiment, the plurality of carbon nanotubes are single-wall carbon nanotubes or double-wall carbon nanotubes, the diameter of the plurality of carbon nanotubes is in a range of 1 nanometer to 5 nanometers, the length of the plurality of carbon nanotubes is in a range of 100 nanometers to 1 micrometer. The plurality of carbon nanotubes can be directly grown by the CVD method or transferred from a carbon nanotube array to a target substrate. The carbon nanotube structure 14 extends from the source electrode 15 to the drain electrode 16. In one embodiment, the carbon nanotube structure 14 is a single carbon nanotube.

The materials of the source electrode 15 and the drain electrode 16 are both conductive materials. The conductive material can be metal material. The metal material can be aluminum, copper, tungsten, molybdenum, gold, titanium, palladium or any combination of alloys. In one embodiment, the source electrode 15 and the drain electrode 16 are a metal composite structure composed of metal Au and Ti, the metal composite structure is formed by using electron beam evaporation to deposit metal Au on a surface of metal Ti, a thickness of the metal Au is 50 nanometers, and the thickness of the metal Ti is 5 nanometers. There is a Schottky connection between the source electrode 15 and the carbon nanotube structure 14, and there is also a Schottky connection between the drain electrode 16 and the carbon nanotube structure 14.

Figure 2:
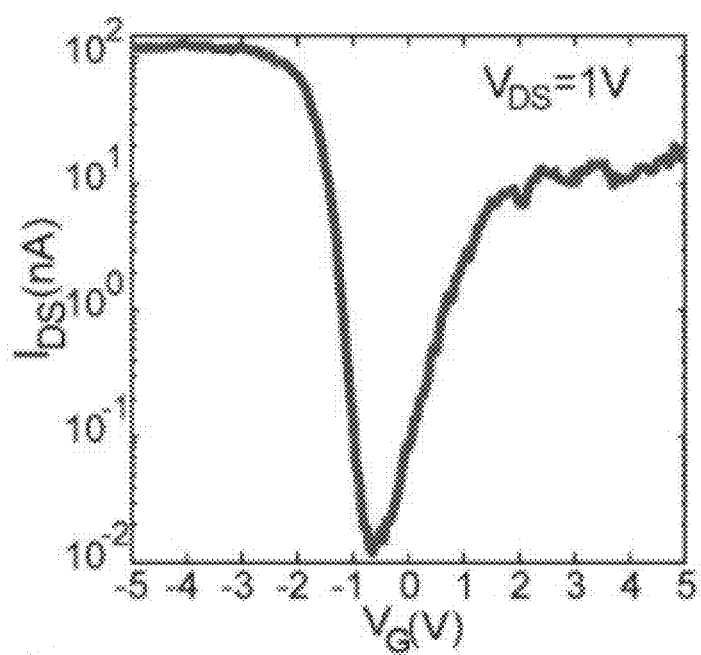
FIG. 2 is an I-V diagram of an embodiment of the thin film transistor.
Figure 3:
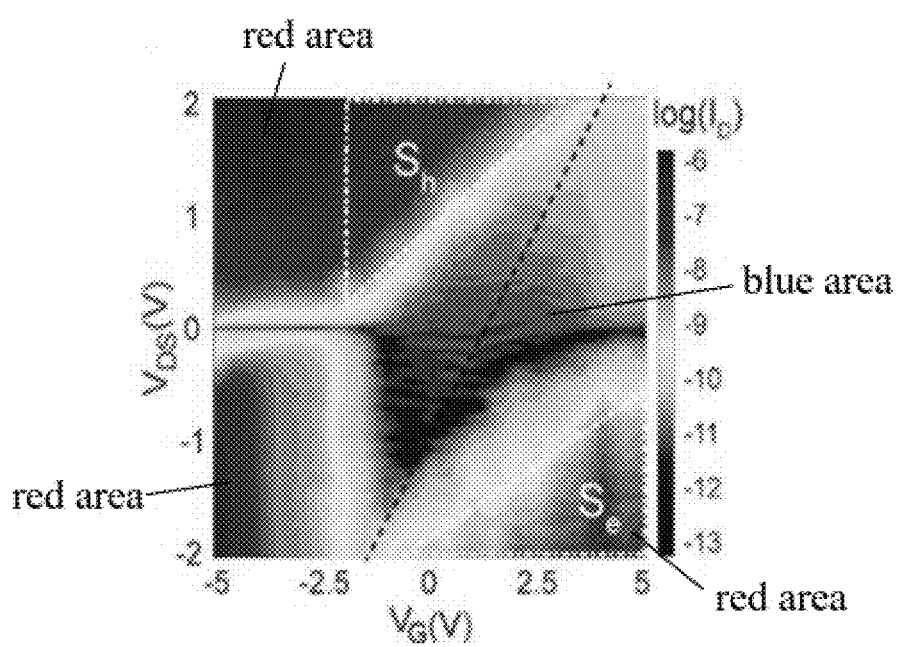
FIG. 3 is an I-V contour map of an embodiment of the thin film transistor.

Referring to FIG. 2, the thin film transistor 10 generally exhibits bipolar semiconductor characteristics in operation, but due to the carbon nanotubes are easily doped by air environment, the on-current of a p-type channel is higher than that of an n-type channel. Referring to FIG. 3, $I_{DS}$ is a drain current, $V_{DS}$ is a bias voltage, $V_G$ is a grid voltage, according to an I-V contour map of the thin film transistor 10, the thin film transistor 10 is a transistor with a self-gating effect. A red area represents an on state, a blue area represents an off state, and the off state shows a parallelogram-like outline, and the thin film transistor 10 exhibits significant reconfigurable rectification within the $V_G$ range limited by the parallelogram-like outline. A dominant region of a p-type Schottky barrier and a dominant region of an n-type Schottky barrier are separated by a black dashed line. When $V_G$ is on the left side of −2.5V, $V_{DS}$ shows symmetrical characteristics, this is because a large −$V_G$ can shrink both Schottky barrier regions, allowing current to tunnel through holes in both directions. Therefore, when $V_G$ is on the left side of −2.5V, the thin film transistor 10 does not have a reconfigurable rectification characteristic. When $V_G$ is on the right side of −2.5V, the width of the Schottky barrier becomes wider, and the width of the Schottky barrier near the drain electrode 16 is affected by the self-gating effect induced by the drain electrode 16, thus $V_{DS}$ shows asymmetric characteristics.

Figure 4:
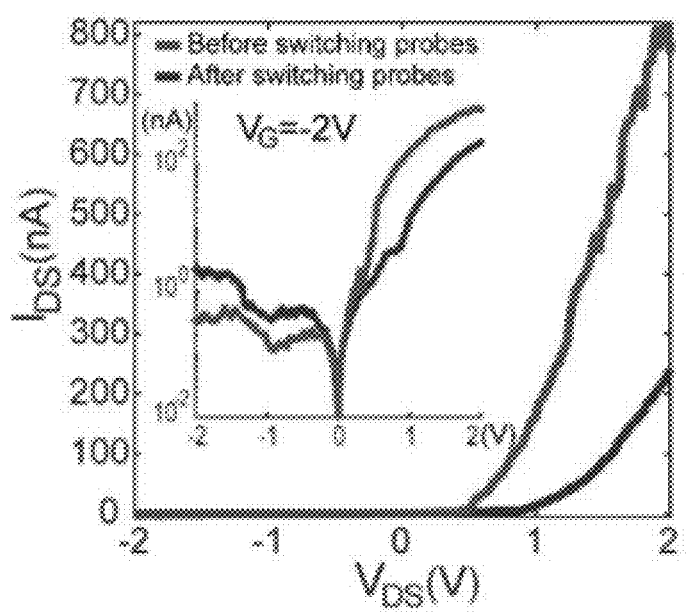
FIG. 4 is an I-V diagram of an embodiment of the thin film transistor when a gate voltage $V_G$ is −2 V.
Figure 5:
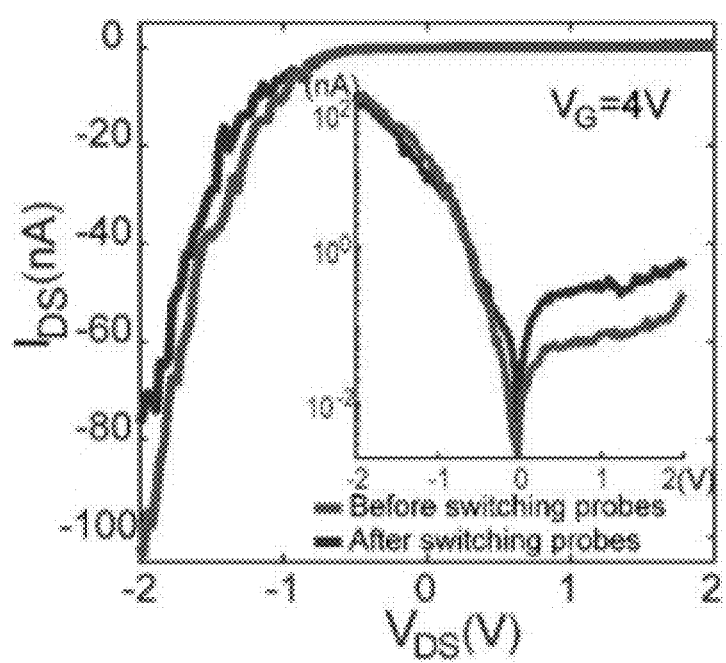
FIG. 5 is an I-V diagram of an embodiment of the thin film transistor when a gate voltage $V_G$ is 4 V.
Figure 6:
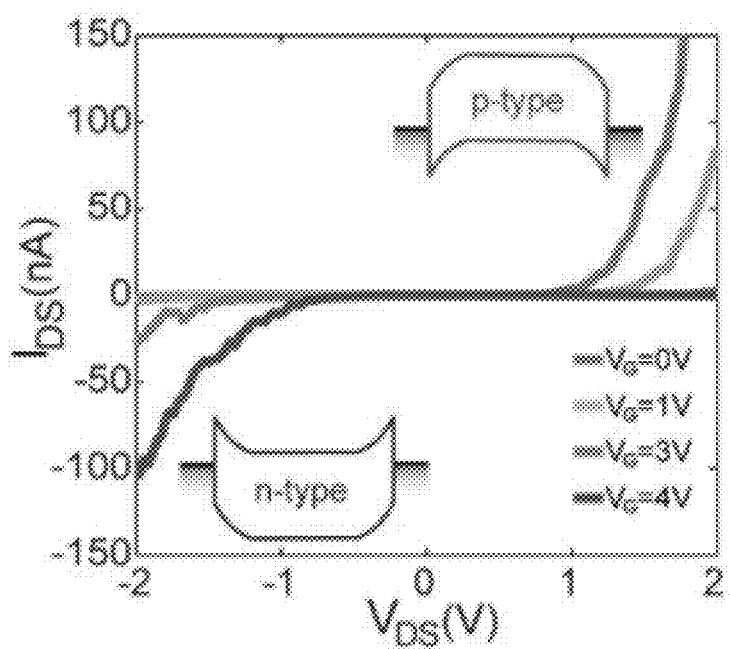
FIG. 6 is an I-V diagram of an embodiment of the thin film transistor under different gate voltages.
Figure 7:
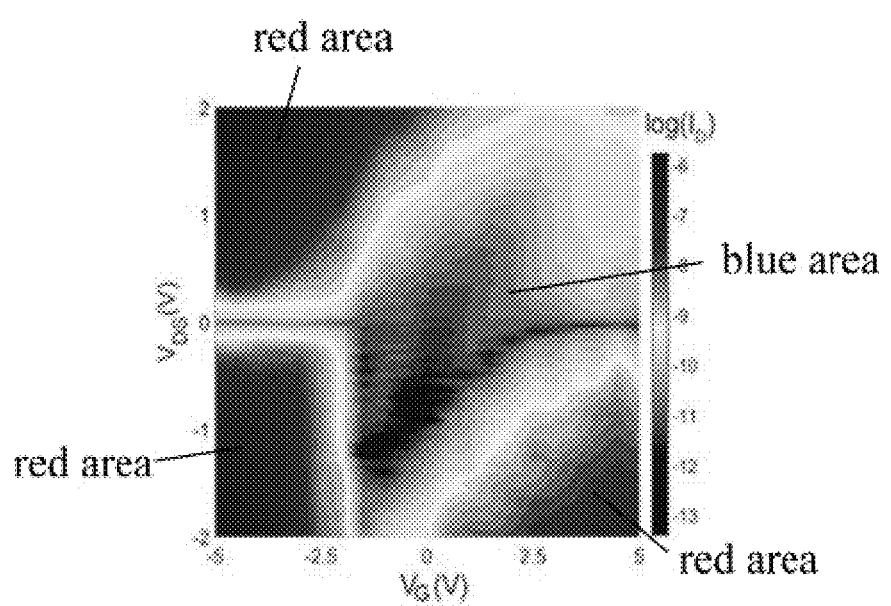
FIG. 7 is an I-V contour map of an embodiment of the thin film transistor after a source electrode and a drain electrode are interchanged.

Referring to FIGS. 4-6, as the gate voltage $V_G$ changes from −2.5V to 4V, the rectification characteristic of the thin film transistor 10 gradually changes from forward rectification to reverse rectification, and the conduction channel is modulated from hole conduction to electron conduction. Referring to FIG. 4, when the gate voltage $V_G$ is −2V, the channel 142 is lightly p-doped, and the output curve shows forward rectification, that is, current only exists when a positive drain voltage is applied. When the source electrode 15 and the drain electrode 16 are interchanged, the output curve of the thin film transistor 10 still shows forward rectification. When the bias voltage $V_{DS}$ is +2V or −2V, a rectification factor is about $10^3$. Referring to FIG. 5, when the gate voltage $V_G$ is +4V, the output curve shows reverse rectification, and current only exists when a positive drain voltage is applied. When the source electrode 15 and the drain electrode 16 are interchanged, the output curve of the thin film transistor 10 still shows reverse rectification, and a rectification factor is about $10^3$. Referring to FIGS. 4-6, the thin film transistor 10 with bipolar channels have reconfigurable rectification characteristics. Referring to FIG. 7, when the source electrode 15 and the drain electrode 16 are interchanged, the I-V contour map of FIG. 7 is almost the same as the I-V contour map of FIG. 3, and the rectification characteristics of the thin film transistor 10 comes from the self-gating effect induced by the drain.

In the thin film transistor 10, the carbon nanotube structure 14 is sensitive to environmental charges due to its specific 1D geometry, any symmetry breaking in the surrounding electrostatic potential will cause significant asymmetry output curves. Due to the source electrode 15 and the drain electrode 16 of the thin film transistor 10 are symmetrical, the self-gating effect can be attributed to the asymmetry of the electrostatic potential between the source electrode 15 and the drain electrode 16. The asymmetry of the electrostatic potential between the source electrode 15 and the drain electrode 16 can be called a biased drain. The biased drain can generate additional charges in two ways, the two ways can include capacitive induction of electrostatic charge on the gate electrode 11 and interface charges on the gate insulating layer 12. However, the interface charges on the gate insulating layer 12 can be removed by heating, but the electrostatic charge on the gate electrode 11 is independent of temperature. Referring to FIG. 8A-8C, the I-V contour maps of the thin film transistor 10 at room temperature (RT) and 180 degrees Celsius are showed, the self-gating effect is obvious at room temperature, and disappears at 180 degrees Celsius, and when the temperature returns to room temperature, the self-gating effect recovers. Therefore, the self-gating effect of the thin film transistor 10 is caused by interface charges, not by the gate electrode 11. Therefore, the interface charges near the channel of the carbon nanotubes can be redistributed under the effect of the biased drain, resulting in asymmetry between the two Schottky contacts, thereby showing a rectified output characteristic.

Figure 9A:
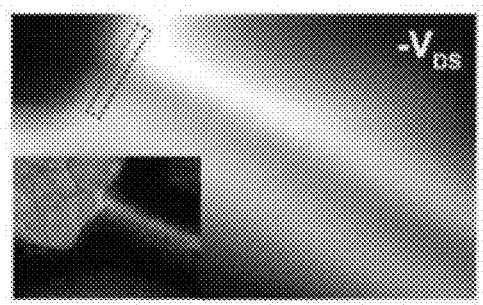
FIG. 9A is a KPFM diagram and AFM phase diagram of an embodiment of the thin film transistor when $V_G$ is 0 V and $V_{DS}$ is −0.5 V.
Figure 9B:
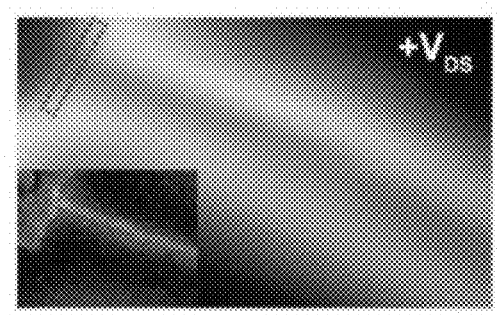
FIG. 9B is a KPFM diagram and AFM phase diagram of an embodiment of the thin film transistor when $V_G$ is 0 V and $V_{DS}$ is +0.5 V.
Figure 10:
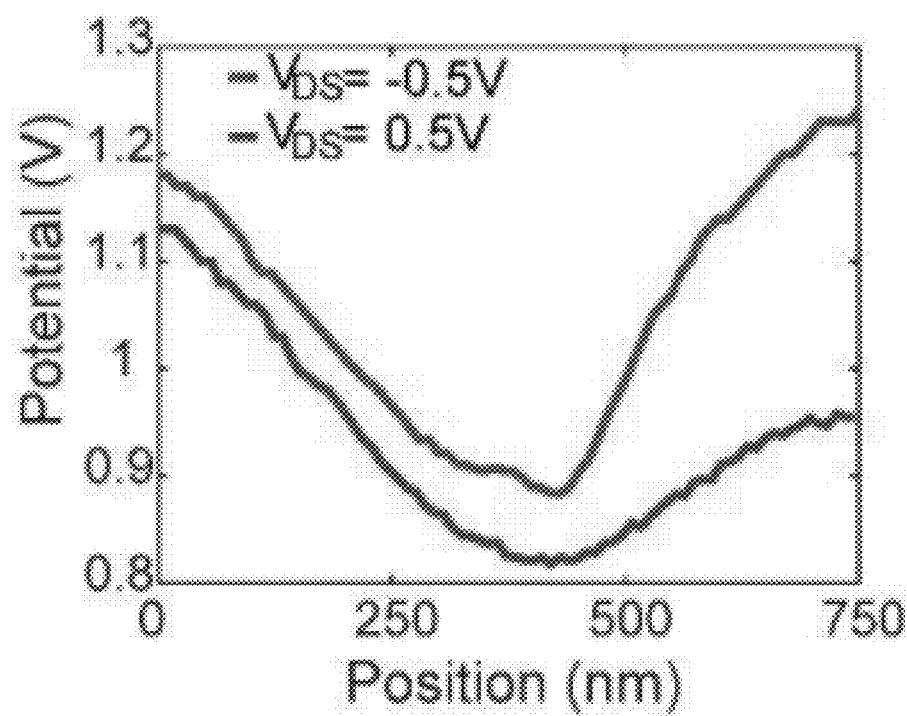
FIG. 10 is a surface potential distribution diagram of an embodiment of the thin film transistor at +/− $V_{DS}$.
Figure 11A:
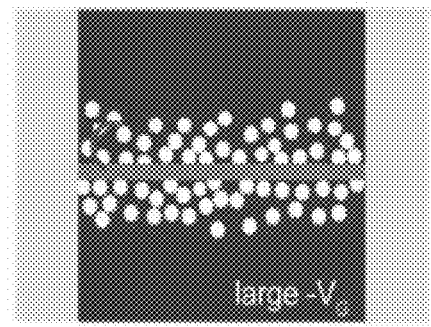
FIG. 11A is physical diagrams of interface charges redistribution near the electrodes of the thin film transistor under a drain bias voltage with a lager $V_G$.
Figure 11B:
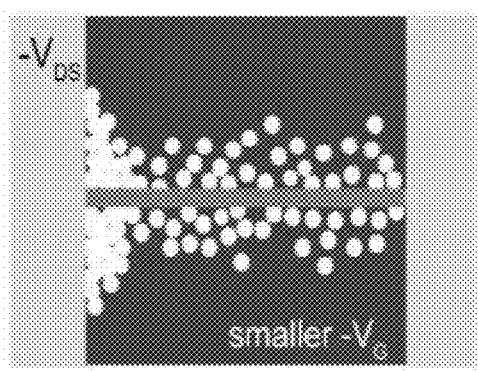
FIG. 11B is physical diagrams of interface charges redistribution near the electrodes of the thin film transistor under a drain bias voltage with a smaller $V_G$.
Figure 11C:
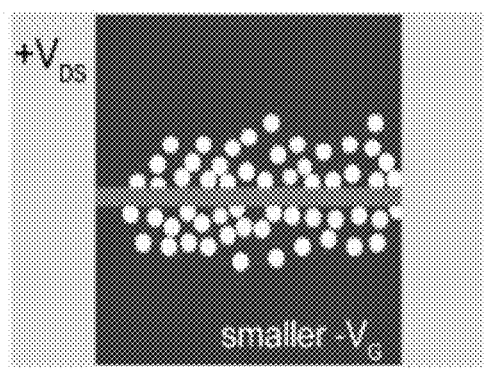
FIG. 11C is physical diagrams of interface charges redistribution near the electrodes of the thin film transistor under a drain bias voltage with a smaller $V_G$.

Referring to FIG. 9A-9B, a Kelvin probe force microscope (KPFM) is used to obtain a surface potential distribution map around the drain electrode 16, the gate voltage of the thin film transistor 10 is switched from −20V to 0V, and the two KPFM images and the corresponding AFM phase images are $V_{DS}$=+/−0.5V and $V_G$=0V respectively. A bright area in the FIG. 9A-9B represents the accumulation of positive charge introduced by the negative gate voltage. Referring to FIG. 10, the local positive potential near the bias drain electrode at −$V_{DS}$ is higher than +$V_{DS}$, so it shows that electrostatic interaction can cause surface charge to redistribute. Referring to FIG. 11, diagrams of interface charges redistribution near the electrodes under drain biases are showed, by applying +$V_{DS}$, the positive interface charges is repelled by the drain electrode; on the contrary, by applying −$V_{DS}$, the positive interface charges is accumulated near the drain electrode.

Referring to FIGS. 12A-12D, since the Fermi level of the source electrode 15 and the drain electrode 16 prepared by Ti/Au are close to the midpoint of the band gap of carbon nanotubes, two symmetric Schottky barriers with relatively high electrons and holes are formed between the carbon nanotube structure 14 and the source electrode 15 and the drain electrode 16. Referring to in FIGS. 12A-12B, when $V_G$ is a negative gate voltage, holes are majority carriers, and a p-type Schottky barrier is formed between the carbon nanotube channel and the electrodes. When +$V_{DS}$ is applied, the Schottky barrier near the drain electrode is a reverse bias barrier, hole transport is dominated, and the positive interface charges around the drain electrode is redistributed by electrostatic effect, which significantly reduces the thickness of the Schottky barrier. Therefore, a current flowing through the channel of a narrowed Schottky barrier region can increase rapidly with the increase of $V_{DS}$. When −$V_{DS}$ is applied, a reverse Schottky barrier region is located at the source electrode, the thickness of the reverse Schottky barrier region increases and the reverse Schottky barrier region can prevent hole transport. Therefore, the thin film transistor 10 exhibits forward rectification characteristics, with a high forward current at +$V_{DS}$ and a low reverse current at −$V_{DS}$. Referring to in FIGS. 12C-12D, when $V_G$ is a positive gate voltage, electrons are majority carriers, and a n-type Schottky barrier is formed between the carbon nanotube channel and the electrodes. When −$V_{DS}$ is applied, the interface charges reduce the width of the reverse Schottky barrier, forming an electron channel. When +$V_{DS}$ is applied, the reverse Schottky barrier near the source electrode 15 can prevent electron tunneling. Therefore, the output curve of the n-type Schottky barrier exhibits reverse rectification characteristics. Therefore, the interface charges act as a medium for coupling the drain bias voltage and the carbon nanotube channel through electrostatic interaction, which determines the output characteristics of the reconfigurable rectification. The function of the interface charges is equivalent to an additional gate electrode around the drain electrode. And the interface charges can be called self-gate electrode. The interface charges also directly make the two Schottky barriers on the carbon nanotube channel asymmetric.

Figure 13:
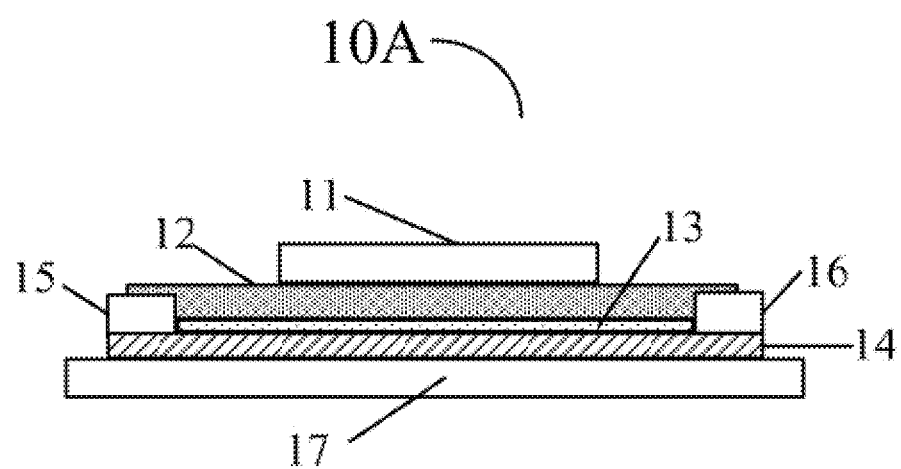
FIG. 13 is a schematic view of another embodiment of the thin film transistor.

Referring to FIG. 13, another embodiment of a thin film transistor 10A is provided. The thin film transistor 10A includes a gate electrode 11, a gate insulating layer 12, an interface charge layer 13, a carbon nanotube structure 14, a substrate 17, a source electrode 15 and a drain electrode 16. The carbon nanotube structure 14 is disposed on a surface of the substrate 17. The source electrode 15 and the drain electrode 16 are arranged at intervals, and are electrically connected to the carbon nanotube structure 14 respectively. The gate insulating layer 12 is disposed on a surface of the carbon nanotube structure 14. The interface charge layer 13 is located between the carbon nanotube structure 14 and the gate insulating layer 12. In one embodiment, the interface charge layer 13 is in direct contact with the surface of the gate insulating layer 12, the carbon nanotube structure 14 is in direct contact with a surface of the interface charge layer 13 away from the gate insulating layer 12. The gate electrode 11 is disposed on a surface of the gate insulating layer 12.

The thin film transistor 10A is similar to the thin film transistor 10 except that the thin film transistor 10A is a top-gate electrode thin film transistor, and the thin film transistor 10 is a bottom-gate electrode thin film transistor. The carbon nanotube structure 14 is directly disposed on the surface of the substrate 17. The substrate 17 is used to support the carbon nanotube structure 14.

Figure 14:
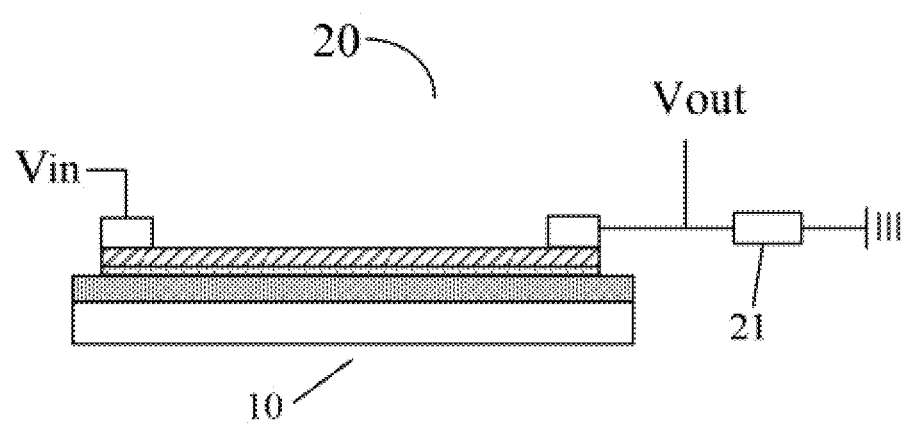
FIG. 14 is a schematic view of an embodiment of a filter.

Referring to FIG. 14, an embodiment of a filter 20 is provided, the filter 20 is prepared by using the thin film transistor 10. The filter 20 includes the thin film transistor 10 and a resistor 21. The thin film transistor 10 and the resistor 21 are connected in series in a circuit. The filter 20 can be used in all-pass, positive-pass and negative-pass rectification modes under different gate voltages.

Figure 15:
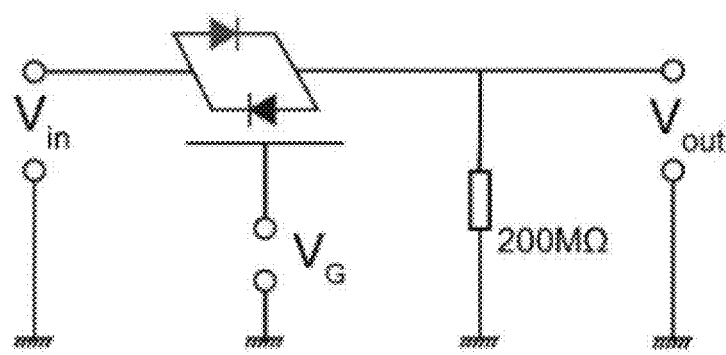
FIG. 15 is a circuit diagram of an embodiment of the filter.
Figure 16:
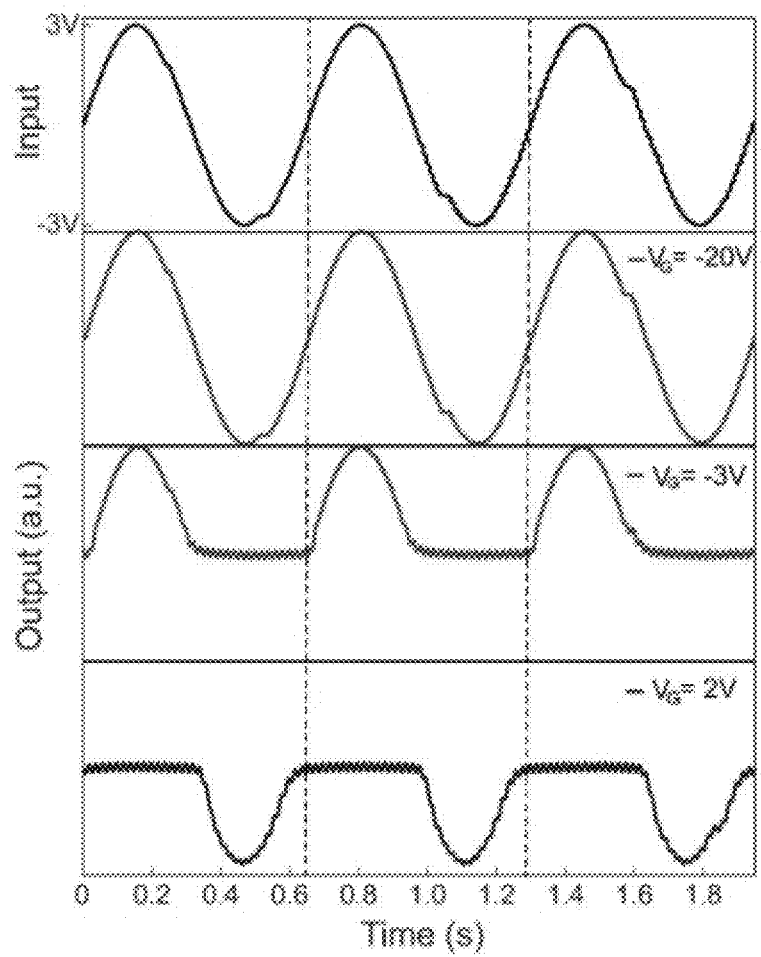
FIG. 16 is a diagram of the rectification effect of the filter under different gate voltages.

Referring to FIGS. 15-16, according to a circuit diagram of the filter 20, a sine wave voltage of 3V is applied to the drain electrode 16, and a resistance of the resistor 21 connected in series to the source electrode 15 is 200 MΩ. When the gate voltage is less than −10V, such as $V_G$=−20V, the filter 20 is in the all-pass mode, that is, currents in both directions can flow through the filter 20. When the gate voltage $V_G$=−3V, the filter 20 is in a forward pass mode, that is, only a positive half-wave currents flow through the filter 20. On the contrary, when the gate voltage $V_G$=+2V, the filter 20 is in a negative pass mode, that is, only the negative half-wave currents flow through the filter 20.

Since the interface charge can act as an additional gate electrode in the Schottky barrier region near the drain electrode, when the bipolar carbon nanotube channel is switched between p-type and n-type through a gate voltage, holes or electrons can only be injected into the channel through the narrow Schottky barrier region at the drain electrode, which makes the thin film transistor formed by the interface charge layer have a reconfigurable rectification behavior. At the same time, the gate modulation makes the forward rectification and the reverse rectification switch mutually.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

Depending on the embodiment, certain of the steps of methods described may be removed, others may be added, and the sequence of steps may be altered. The description and the claims drawn to a method may comprise some indication in reference to certain steps. However, the indication used is only to be viewed for identification purposes and not as a suggestion for ordering the steps.

What is claimed is:

1. A thin film transistor comprising:
   a gate electrode;
   a carbon nanotube structure;
   a gate insulating layer between the gate electrode and the carbon nanotube structure;
   a source electrode and a drain electrode electrically insulated from each other and each electrically connected to the carbon nanotube structure; and
   an interface charge layer between the carbon nanotube structure and the gate insulating layer, wherein the interface charge layer comprises charges captured by chemical molecular groups or water molecules.

2. The thin film transistor as claimed in claim 1, wherein the interface charge layer is in direct contact with a surface of the gate insulating layer.

3. The thin film transistor as claimed in claim 1, wherein the interface charge layer is redistributed under a bias voltage between the source electrode and the drain electrode.

4. The thin film transistor as claimed in claim 1, wherein the charges are confined within the interface charge layer.

5. The thin film transistor as claimed in claim 1, wherein the carbon nanotube structure is a one-dimensional semiconductor structure.

6. The thin film transistor as claimed in claim 1, wherein the carbon nanotube structure comprises at least one carbon nanotubes.

7. The thin film transistor as claimed in claim 6, wherein the carbon nanotube structure comprises a plurality of carbon nanotubes, and the plurality of carbon nanotubes are joined end to end through van der Waals force to form a plurality of carbon nanotube wires.

8. The thin film transistor as claimed in claim 7, wherein the plurality of carbon nanotubes extend substantially in a same direction.

9. The thin film transistor as claimed in claim 1, wherein the thin film transistor is adapted for reconstruction rectification when a gate voltage is in a range of −2.5 V to 4 V.

10. The thin film transistor as claimed in claim 9, wherein when the gate voltage changes from −2.5 V to 4 V, the reconstruction rectification of the thin film transistor changes from forward rectification to reverse rectification.

11. A filter comprising:
    a resistor; and
    a thin film transistor, the thin film transistor and the resistor connected in series in a circuit, the thin film transistor comprising:
    a gate electrode;
    a carbon nanotube structure;
    a gate insulating layer between the gate electrode and the carbon nanotube structure;
    a source electrode and a drain electrode electrically insulated from each other and each electrically connected to the carbon nanotube structure; and
    an interface charge layer between the carbon nanotube structure and the gate insulating layer.

12. The filter as claimed in claim 11, wherein when a gate voltage is less than −10V, the filter is in an all-pass mode, currents in both directions flow through the filter.

13. The filter as claimed in claim 11, wherein when a gate voltage is −3V, the filter is in a forward pass mode, only a positive half-wave currents flow through the filter.

14. The filter as claimed in claim 11, wherein when a gate voltage is +2V, the filter is in a negative pass mode, only a negative half-wave currents flow through the filter.

15. The filter as claimed in claim 11, wherein the interface charge layer comprises charges captured by chemical molecular groups or water molecules.

16. The filter as claimed in claim 15, wherein the interface charge layer is redistributed under a bias voltage between the source electrode and the drain electrode.

17. The filter as claimed in claim 15, wherein the charges are confined within the interface charge layer.

18. The filter as claimed in claim 11, wherein the plurality of carbon nanotubes extend substantially in a same direction.

19. The filter as claimed in claim 11, wherein the thin film transistor is adapted for reconstruction rectification when a gate voltage is in a range of −2.5 V to 4 V.

20. The filter as claimed in claim 19, wherein when the gate voltage changes from −2.5 V to 4 V, the reconstruction rectification of the thin film transistor changes from forward rectification to reverse rectification.

* * * * *